United States Patent
Zhao et al.

(10) Patent No.: US 12,439,510 B1
(45) Date of Patent: Oct. 7, 2025

(54) EASY-TO-ASSEMBLE LARGE-CURRENT COMPOSITE CIRCUIT BOARD AND MANUFACTURING PROCESS THEREFOR

(71) Applicant: Guangdong EREVO Electrical Technology Co., Ltd, Guangdong (CN)

(72) Inventors: Yan Zhao, Guangdong (CN); Yinghao Fu, Guangdong (CN); Ning Shi, Guangdong (CN)

(*) Notice: Subject to any disclaimer, the term of this patent is extended or adjusted under 35 U.S.C. 154(b) by 0 days.

(21) Appl. No.: 19/266,214

(22) Filed: Jul. 11, 2025

(30) Foreign Application Priority Data

Jul. 11, 2024 (CN) .......................... 202410924751.6

(51) Int. Cl.
*H05K 1/02* (2006.01)
*H05K 3/28* (2006.01)

(52) U.S. Cl.
CPC ............. *H05K 1/0265* (2013.01); *H05K 3/28* (2013.01)

(58) Field of Classification Search
CPC ................ H05K 1/111; H05K 1/0265; H05K 2201/0367; H05K 2201/10287; H05K 2201/10409; H05K 2203/0415; H05K 7/1417; H05K 7/142; H01R 12/585; H01L 2224/05554; H01L 2224/13013
See application file for complete search history.

(56) References Cited

U.S. PATENT DOCUMENTS

2014/0211432 A1* 7/2014 Lozano ................ H05K 7/142
361/759

FOREIGN PATENT DOCUMENTS

| CN | 102378480 A | | 3/2012 |
|---|---|---|---|
| CN | 206879214 U | * | 1/2018 |
| CN | 113923859 A | | 1/2022 |
| CN | 219067246 U | | 5/2023 |

OTHER PUBLICATIONS

English Machine Translation of MA (CN206879214) provided with Office Action (Year: 2018).*

* cited by examiner

*Primary Examiner* — Roshn K Varghese
(74) *Attorney, Agent, or Firm* — Birchwood IP

(57) ABSTRACT

A base plate assembly based on a manufacturing process of a composite circuit board according to the invention has a better load-bearing effect; conductive posts are riveted to the composite circuit board; connecting wires are fixed to upper ends of the conductive posts by means of conductive screws, so that components and the composite circuit board are electrically connected. The assembly process is simplified and the assembly efficiency is improved. Moreover, the test can be carried out as soon as the conductive posts are riveted. In this way, the problem that the defects of the base plate assembly can be discovered only after the components are assembled can be avoided effectively, thereby reducing the generation of defective products and the rework and maintenance rate and ensuring the pass rate of finished products.

7 Claims, 4 Drawing Sheets

EASY-TO-ASSEMBLE LARGE-CURRENT COMPOSITE CIRCUIT BOARD AND MANUFACTURING PROCESS THEREFOR

BACKGROUND OF THE INVENTION

1. Technical Field

The present invention relates to the technical field of electrical control equipment and, in particular, to an easy-to-assemble large-current composite circuit board and a manufacturing process therefor.

2. Description of Related Art

In electrical control equipment in all walks of life, electrical control boxes are widely used. They are suitable for low-voltage distribution equipment involved in various large-scale production and manufacturing equipment, engineering machinery, new energy-related equipment, high-speed rail and ships, buildings and elevators, etc.

At present, during the manufacturing process of conventional electrical control boxes on the market, electrical components are manually installed and fixed in the electrical boxes, and then electrical wires are routed and connected according to the electrical schematic diagram. The entire installation process is carried out by workers manually routing the wires and connecting them together to complete production assembly. Assembling in this way not only reduces production efficiency, but also increases labor intensity of workers. With long-term work, routing errors are prone to occur. This leads to installation errors, resulting in high consumption of raw materials and increased labor costs. In addition, due to the use of connecting wires for wire routing, multiple strands of wire harnesses are formed inside, and the product is large and cannot be reduced in size.

At present, some electrical components on the market use PCBs instead of conventional wiring connections, so that the electrical components and PCBs are connected together by wires, reducing wiring situations. And wires and PCBs are connected by soldering technique, which can reduce the number of wire harnesses formed inside and reduce the size. However, for assembly and production by this method, the assistance of another person is needed during the process of soldering the connection between the wires and the PCBs. One person positions and holds the electrical components on the front, and the other person performs solder processing on the back. Although production and assembly efficiency can be accelerated by means of this structure, labor costs are high. Moreover, the product needs to be tested after the soldering is completed. Once the product fails in the test, disassembly and reassembly are very troublesome, and the material is easily scrapped; and for large-current circuit boards, the use of the welding process is prone to weak welding, resulting in insufficient connection stability and poor reliability.

Therefore, a novel technical solution needs to be developed to solve the above problems.

BRIEF SUMMARY OF THE INVENTION

In view of this, aiming at the shortcomings in the prior art, a main objective of the present invention is to provide an easy-to-assemble large-current composite circuit board and a manufacturing process therefor.

In order to achieve the above objective, the present invention adopts the following technical solutions:

An easy-to-assemble large-current composite circuit board comprises a base plate assembly. The base plate assembly consists of an outer shell, an insulating board, a composite circuit board and an insulating packaging layer in turn from top to bottom; the composite circuit board is provided with insulating grooves and mounting holes for conducting electricity; and through holes corresponding to the positions of the mounting holes are formed in the outer shell and the insulating board.

As a preferred embodiment, the composite circuit board is made by laminating a metal layer, an adhesive layer and a polymer material insulating layer in turn, and the insulating grooves and the mounting holes are formed in the metal layer by milling and thinning processing.

As a preferred embodiment, each of the insulating grooves is filled with a sealing layer for isolation and protection, and the sealing layer comprises a sealing film prefabricated from an insulating material or is flow-filled and formed by using a liquid insulating material.

As a preferred embodiment, the insulating board, the insulating packaging layer and the sealing layer are made of epoxy resin materials; the polymer material insulating layer is made of an epoxy resin, a glass fiber board, a bakelite board, a silica gel board or a plastic board.

As a preferred embodiment, the metal layer is made of a pure copper plate, an alloy copper plate or an alloy aluminum plate, the material used for the adhesive layer is prepreg, the thickness of the metal layer is 0.2 mm to 3 mm, the thickness of the polymer material insulating layer is 0.5 mm to 5 mm, and the total thickness of the composite circuit board is 0.9 mm to 8.2 mm.

As a preferred embodiment, the easy-to-assemble large-current composite circuit board further comprises conductive posts, each of the conductive posts consists of an upper end portion and a lower end portion, the diameter of the lower end portion is less than that of the upper end portion, the lower end portion of the conductive post sequentially passes through the through holes of the outer shell and the insulating plate and the mounting hole of the composite circuit board to be fixedly installed on the base plate assembly, and an upper end face of the upper end portion of the conductive post is provided with an internally threaded hole extending from top to bottom.

As a preferred embodiment, the conductive posts are installed and fixed on the base plate assembly by means of a riveting technique, so that the lower end portions of the conductive posts are fixed to the lower end face of the composite circuit board by means of riveting.

As a preferred embodiment, the easy-to-assemble large-current composite circuit board further comprises components and connecting wires. The components are installed and fixed on the base plate assembly; the connecting wires are provided between the components and the conductive posts; and the connecting wires have one ends connected and fixed to the components and the other ends installed in the internally threaded holes of the conductive posts by means of conductive screws, thereby realizing a conducting state.

A manufacturing process for an easy-to-assemble large-current composite circuit board includes the following steps:
S1: material preparation and pressing formation of a composite circuit board: pressing a metal layer, an adhesive layer and a polymer material insulating layer into a whole board by a pressing device;
S2: machining of the composite circuit board: milling and thinning a metal plate of the composite circuit board by means of a numerical control milling machine to form insulating grooves and mounting holes;

S3: placing a sealing layer into each insulating groove on the composite circuit board, wherein the sealing layer is prefabricated or poured into the insulating groove in the form of a fluid;

S4: performing laser cutting by means of laser equipment to form an outer shell, and processing the outer shell by means of sheet-metal working equipment;

S5: printing circuit symbols and related information on the formed outer shell;

S6: installation of conductive posts: riveting the conductive posts to the composite circuit board by means of a riveting machine according to the pre-formed mounting holes, with a lower end of each conductive post being riveted and fixed to the composite circuit board to achieve a conducting effect;

S7: assembly of a base plate assembly: placing the insulating plate and the composite circuit board with the riveted conductive posts into the outer shell in turn for stacking and assembly, and then providing an adhesive material at a connection between the composite circuit board and an inner end face of the outer shell;

S8: preliminary test and inspection: conducting a power-on test on the base plate assembly provided with the conductive posts to detect whether there is a short circuit or other situations;

S9: after the completion of the preliminary test, applying an protective adhesive to the riveted surface of qualified base plate assemblies to play a role of insulating protection;

S10: installing components according to pre-formed holes, and spacing adjacent components apart by a certain distance for heat dissipation;

S11: installation of connecting wires: connecting and fixing one ends of the connecting wires to the components and then placing the other ends of the connecting wires on the conductive posts, and screwing and fixing the other ends of the connecting wires on the conductive posts by means of conductive screws passing therethrough, thus forming a complete electric conducting state;

S12: finished product testing: re-testing the assembled finished products to screen out defective products; and S13: packing.

As a preferred embodiment, after being finished in S9, the base plate assembly may be used immediately for assembly or stored in a warehouse for later use.

Compared with the prior art, the present invention has obvious advantages and beneficial effects. Specifically, it can be seen from the above technical solutions that:

the composite circuit board of the present invention has a simple structure and is convenient and quick to use; the base plate assembly based on the manufacturing process of the composite circuit board has a better load-bearing effect, and the conductive posts are riveted to the composite circuit board by means of a riveting technique, and then the connecting wires are fixed to the upper ends of the conductive posts by means of the conductive screws, so that the components and the composite circuit board are electrically connected. Due to this structure, the assembly process can be simplified, the assembly efficiency can be improved, and good safety and reliability are achieved. Moreover, the test can be carried out as soon as the conductive posts are riveted. In this way, the problem that the defects of the base plate assembly can be discovered only after the components are assembled can be avoided effectively, thereby reducing the generation of defective products and the rework and maintenance rate, ensuring the pass rate of finished products, and reducing the production cost of enterprises.

1. Use of a composite circuit board to replace the conventional PCB board enhances the load-bearing capacity of the base plate assembly so that the base plate assembly can withstand the weight and current of more components. In addition, grooves and holes are formed in the composite circuit board so that the composite circuit board has a wire conducting effect. Moreover, the grooves are filled with an insulating material for isolation and protection to avoid short circuits. The base plate assembly is made in a four-layer structure, which comprises the outer shell, the insulating board, a composite circuit board and the insulating packaging layer. By printing information patterns such as electrical symbols, component names and numbers on the upper end face of the outer shell, subsequent assembly can be facilitated and efficiency can be improved. In addition, the base plate assembly can be fabricated and assembled in advance, and then transported to an assembly workshop, reducing the overall assembly time and further improving production assembly efficiency.

2. The conductive posts are made of a copper material and has good conductivity. The conductive posts are fixed on the composite circuit board by means of a riveting technique. The inner upper end of each conductive post is also provided with an internal thread, so that the connecting wires can be fixed to the conductive post by means of conductive screws with a locking function, thereby forming a conducting effect and achieving good reliability and stability.

3. The components used are connected to the conductive posts by using multiple connecting wires to achieve an electrical connection state, so that the components can be quickly disassembled and disassembled, thereby improving assembly efficiency, and also realizing non-destructive disassembly and disassembly, and reducing the scrapping of parts.

4. During the assembly process, multiple insulating layers are also used for protection, thereby effectively protecting the composite circuit board therein and the connection stability and safety of the components, and achieving good dustproof, waterproof, dampproof, anti-corrosion, anti-aging and anti-vibration offset effects.

5. The composite circuit board used is a pure copper plate, a copper alloy plate or an aluminum alloy plate, which can withstand large-current working operation, so that the base plate assembly becomes more selective and applicable to meet the use needs and use scenarios of different customers.

6. the selected composite circuit board has a total thickness of 0.9 mm to 8.2 mm, in which the thickness of the metal layer is 0.2 mm to 3 mm, and the thickness of the polymer material insulating layer is 0.5 mm to 5 mm. By the combined use of different thicknesses, it can meet the needs of use in different scenarios.

BRIEF DESCRIPTION OF THE SEVERAL VIEWS OF THE DRAWINGS

In order to more clearly illustrate the technical solutions in the embodiments of the present application, the following is a brief introduction to the drawings required for the description of the embodiments or the prior art. Obviously, the drawings described below are only some embodiments of the present invention. For those of ordinary skill in the art, other drawings may be obtained based on these drawings without creative labor.

Figure 1:
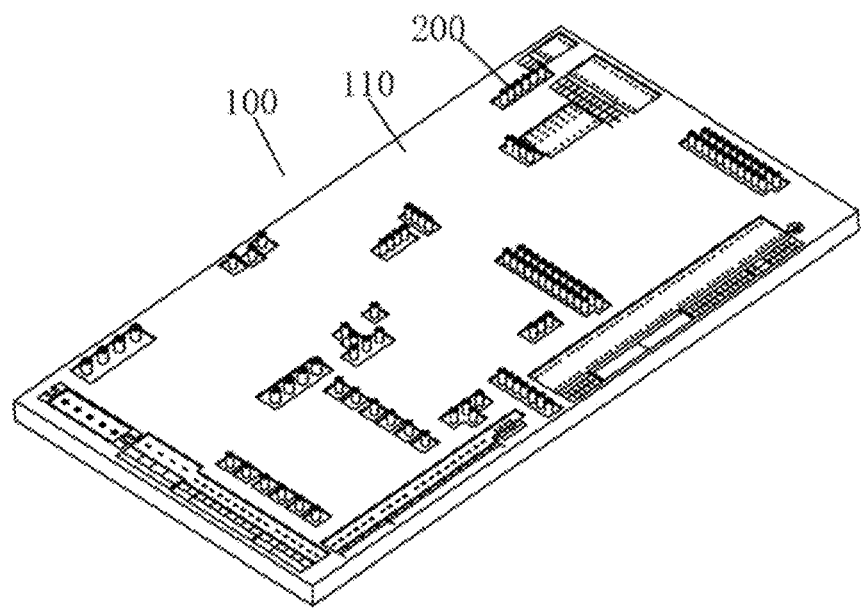
FIG. 1 is an overall schematic structural diagram of a base plate assembly according to the present invention.

REFERENCE NUMERALS 100. base plate assembly; 110. outer shell; 120. insulating plate; 130. composite circuit board; 131. metal layer; 132. adhesive layer; 133. polymer insulating layer; 134. insulating groove; 135. mounting hole; 136. sealing layer; 140. insulating packaging layer; 150. through hole; 200. conductive post; 210. upper end portion; 211. internally threaded hole; 220. lower end portion; 300. component; 400. connecting wire.

DETAILED DESCRIPTION OF THE INVENTION

In order to make the technical problems to be solved, technical solutions and beneficial effects of the present application more clear, the present application will be described in further detail below with reference to the accompanying drawings and embodiments. It should be understood that the specific embodiments described herein are only intended to explain the present disclosure but not to limit the present disclosure.

It should be noted that when an element is referred to as being "fixed" or "disposed" on another element, the element may be directly on the other element or indirectly on the other element. When an element is referred to as being "connected" to another element, the element may be directly connected to the other element or indirectly connected to the other element.

It should be understood that the orientation or position relationships indicated by the terms "length", "width", "up", "down", "front", "back", "left", "right", "vertical", "horizontal", "top", "bottom", "inside", "outside", etc., are based on the orientation or position relationships shown in the accompanying drawings and are used only for the convenience of describing the present application and simplifying the description, rather than indicating or implying that the device or element referred to must have a specific orientation, be constructed and operated in a specific orientation. Therefore, they should not be understood as limiting the present application.

In addition, the terms "first" and "second" are used for descriptive purposes only rather than being understood as indicating or implying relative importance or as implicitly indicating the quantity of technical features indicated. Therefore, the features defined as "first" and "second" may explicitly or implicitly include one or more of the features. As described herein, "a plurality of" means two or more, unless otherwise clearly and specifically defined.

In order to make the objectives, technical solutions and advantages of the invention more clear, the invention is further described in detail in combination with the accompanying drawings and embodiments.

Figure 2:
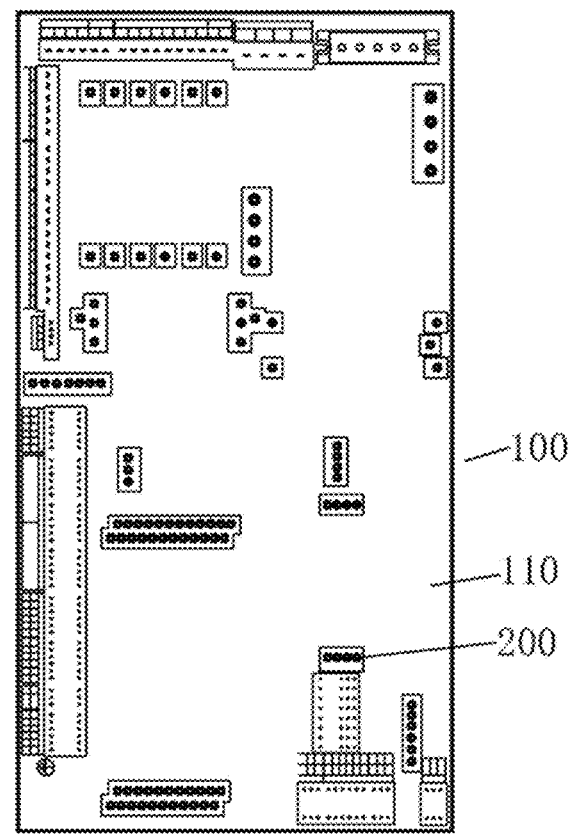
FIG. 2 is a top view of the base plate assembly according to the present invention.
Figure 3:
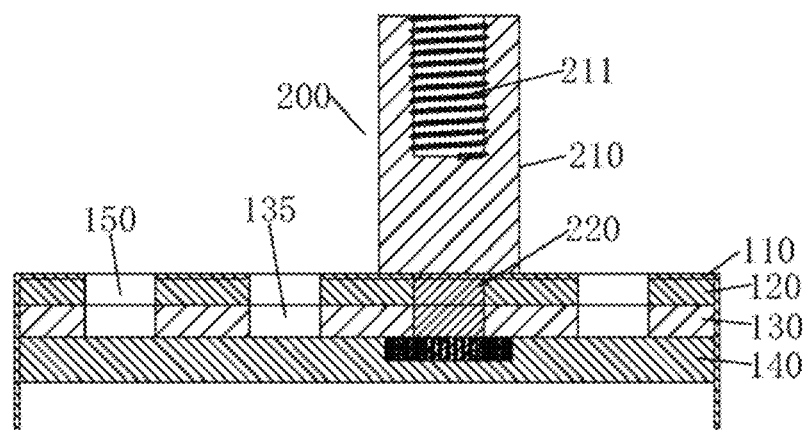
FIG. 3 is a partial schematic sectional view of the base plate assembly according to the present invention.

Referring to FIGS. 1-3, an easy-to-assemble large-current composite circuit board comprises a base plate assembly 100. The base plate assembly 100 consists of an outer shell 110, an insulating board 120, a composite circuit board 130 and an insulating packaging layer 140 in turn from top to bottom. The composite circuit board 130 is provided with insulating grooves 134 and mounting holes 135 for conducting electricity; and through holes 150 corresponding to the positions of the mounting holes 135 are formed in the outer shell 110 and the insulating board 120.

Figure 4:
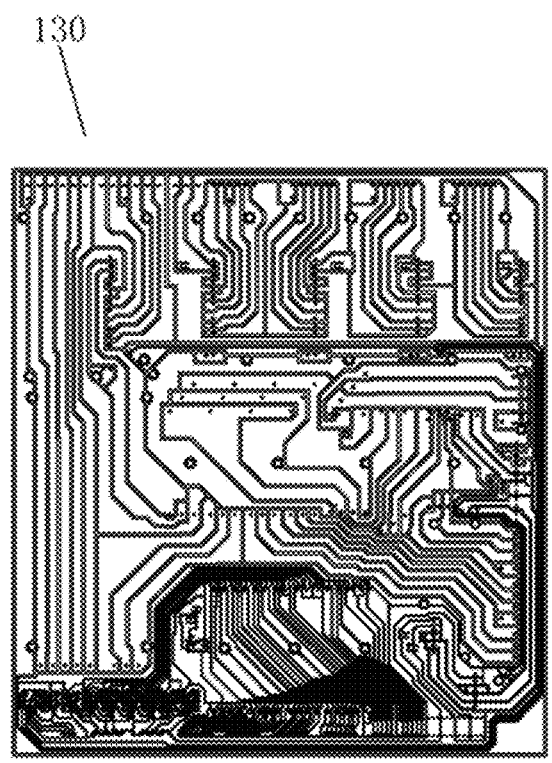
FIG. 4 is a top view of a composite circuit board according to the present invention.
Figure 5:
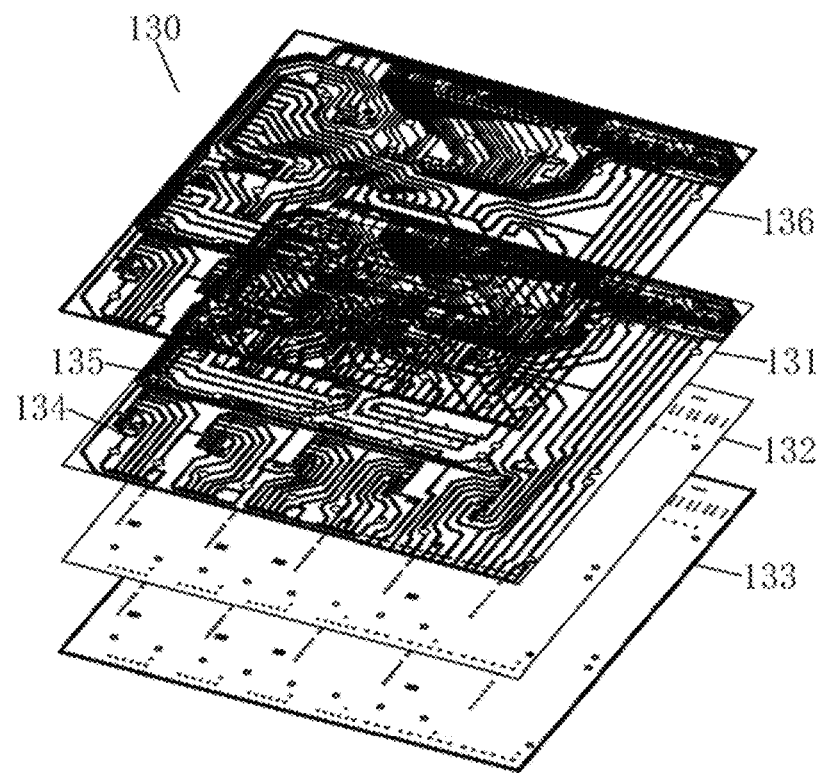
FIG. 5 is an exploded schematic structural diagram of the composite circuit board according to the present invention.

Referring to FIGS. 4-5, in this embodiment, the composite circuit board 130 is made by pressing a metal layer 131, an adhesive layer 132 and a polymer material insulating layer 133 in turn, and the insulating grooves 134 and the mounting holes 135 are formed in the metal layer 131 by milling and thinning processing so that a thinned area and a use area appear in the metal layer 131, and the thinned area is the formed insulating grooves 134.

Further, each of the insulating grooves 134 is filled with a sealing layer 136 for isolation and protection, and the sealing layer 136 comprises a sealing film prefabricated from an insulating material or is flow-filled and formed by using a liquid insulating material. By prefabricating the sealing film, the sealing film can be placed into the insulating groove 134 for insulation protection after the insulating groove 134 is formed; or by pouring a liquid insulating material into the insulating groove 134, the insulating material can be uniformly filled into the insulating groove 134 to form the sealing layer 136 to achieve the effect of insulating protection.

In this embodiment, the insulating board 120, the insulating packaging layer 140 and the sealing layer 136 are made of epoxy resin materials and have a good effect of insulating protection; the polymer material insulating layer 133 is made of an epoxy resin, a glass fiber board, a bakelite board, a silica gel board or a plastic board, which can achieve the insulating effect of isolating the upper and lower layers and preventing short circuits caused by conduction between the upper and lower layers.

In this embodiment, the metal layer 131 is made of a pure copper plate, an copper alloy plate or an aluminum alloy plate, the material used for the adhesive layer 132 is prepreg, the thickness of the metal layer 131 is 0.2 mm to 3 mm, the thickness of the polymer material insulating layer 133 is 0.5 mm to 5 mm, and the total thickness of the composite circuit board 130 is 0.9 mm to 8.2 mm.

Specifically, a plate with a suitable thickness may be selected for the composite circuit board 130 according to use needs, such as a thin composite wiring board 130. For instance, for a light and thin composite circuit board 130, a 0.2 mm thick metal layer 131 and a 0.5 mm thick polymer material insulating layer 133 may be selected for assembly and use, so that the composite wiring board 130 has a total thickness of 0.9 mm, thus being suitable for products with limited space. For a composite circuit board 130 with a conventional thickness, a metal layer 131 with a thickness of 1 mm and a polymer insulating layer 133 with a thickness of 2 mm may also be selected, so that the composite circuit board 130 can meet daily use. If there is a need for carrying more larger-current components 300, a thicker composite circuit board 130 having, such as, a 3 mm thick metal layer 131 and a 5 mm thick polymer material insulating layer 133, may be selected for use, so that more heavier and larger-current components 300 can be carried for use, and the effect of insulating protection can be correspondingly enhanced.

In this embodiment, the easy-to-assemble large-current composite circuit board further comprises conductive posts 200. Each of the conductive posts 200 consists of an upper end portion 210 and a lower end portion 220, the diameter of the lower end portion 220 is less than that of the upper end portion 210, the lower end portion 220 of the conductive post 200 sequentially passes through the through holes 150 of the outer shell 110 and the insulating plate 120 and the mounting hole of the composite circuit board to be fixedly installed on the base plate assembly 100, and an upper end face of the upper end portion 210 of the conductive post 200 is provided with an internally threaded hole 211 extending from top to bottom.

In this embodiment, the conductive posts 200 are installed and fixed on the base plate assembly 100 by means of a riveting technique, so that the lower end portions 220 of the conductive posts 200 are fixed to the lower end face of the composite circuit board 130 by means of riveting.

Figure 6:
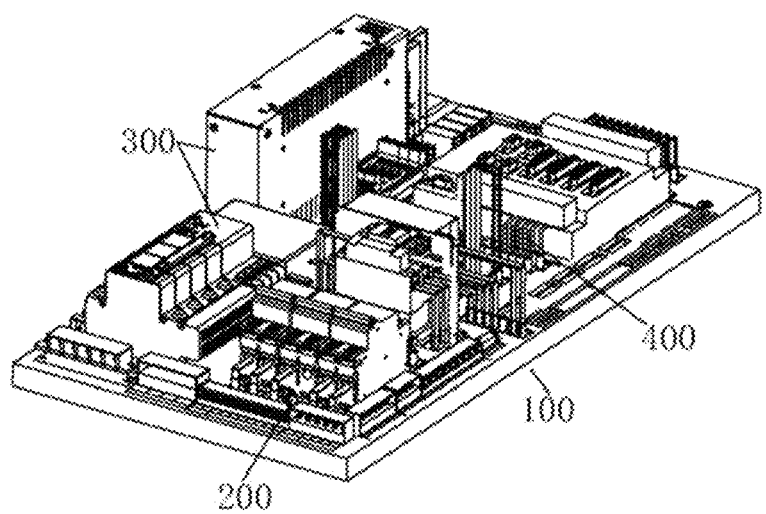
FIG. 6 is a schematic assembly diagram of an electrical component according to the present invention.
Figure 7:
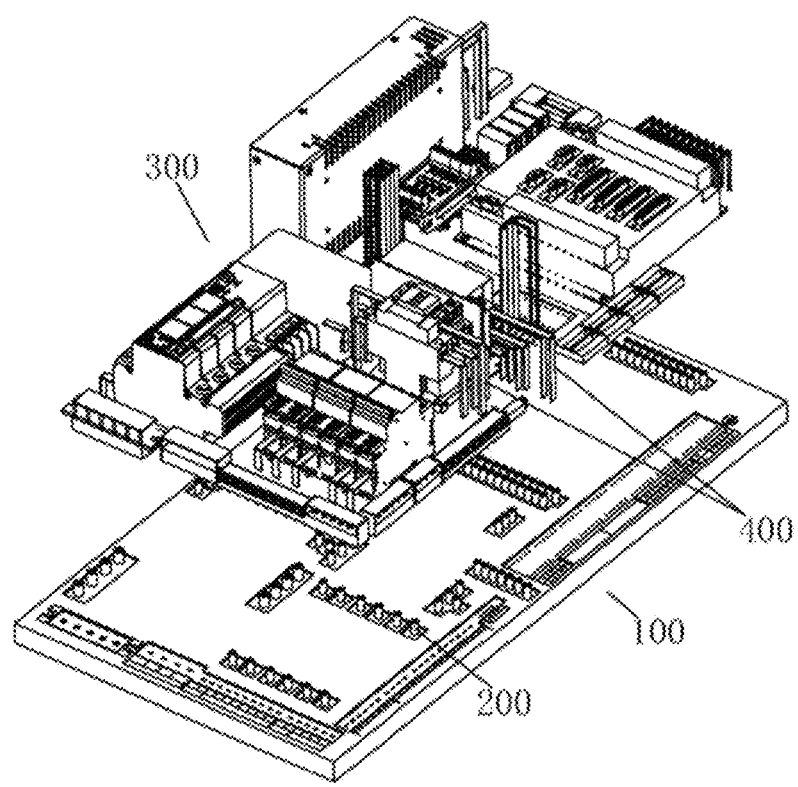
FIG. 7 is an exploded schematic structural diagram of the electrical components according to the present invention.

Referring to FIGS. 6-7, in this embodiment, the easy-to-assemble large-current composite circuit board further comprises components 300 and connecting wires 400. The components 300 are installed and fixed on the base plate assembly 100; the connecting wires 400 are provided between the components 300 and the conductive posts 200; and the connecting wires have one ends connected and fixed to the components 300 and the other ends installed in the internally threaded holes 211 of the conductive posts 200 by means of conductive screws, thereby realizing a conducting state.

Specifically, the components 300 used include electronic components 300 and electrical components 300, which are selected and used according to the use needs of different scenarios to meet different needs of customers.

Further, this product is suitable for installation and use in electrical boxes or electrical cabinets to replace the traditional wiring mode, thereby making assembly and use more convenient and quick, and being capable of withstanding higher currents.

A manufacturing process for an easy-to-assemble large-current composite circuit board includes the following steps:
S1: material preparation: pressing a metal layer 131, an adhesive layer 132 and a polymer material insulating layer 13 into a whole composite circuit board 130 by a pressing device;
S2: machining of the composite circuit board 130: milling and thinning a metal plate of the composite circuit board 130 by means of a numerical control milling machine to form insulating grooves 134 and mounting holes 135;
S3: placing a sealing layer 136 into each insulating groove 134 on the composite circuit board 130, where the sealing layer 136 may be prefabricated or poured into the insulating groove in the form of a fluid;
S4: performing laser cutting by means of laser equipment to form an outer shell 110, forming through holes 150 in the outer shell 110, and processing the outer shell 110 by means of sheet-metal working equipment;
S5: printing circuit symbols and related information on the formed outer shell 110;
S6: installation of conductive posts 200: riveting the conductive posts 200 to the composite circuit board 130 by means of a riveting machine according to the pre-formed mounting holes 135, with a lower end of each conductive post 200 being riveted and fixed to the composite circuit board 130 to achieve a conducting effect;
S7: assembly of a base plate assembly 100: placing the insulating plate 120 and the composite circuit board 130 with the riveted conductive posts into the outer shell 110 in turn for stacking and assembly, and then providing an adhesive material at a connection between the composite circuit board 130 and an inner end face of the outer shell 110, so that the insulating plate 120 and the composite circuit board 130 can be connected and secured in the outer shell 110 by means of the adhesive material after being placed in the outer shell 110, where the adhesive material includes glue made of adhesive and adhesive tapes with adhesive;
S8: preliminary test and inspection: conducting a power-on test on the base plate assembly 100 provided with the conductive posts 200 to detect whether there is a short circuit or other situations;
S9: after the completion of the preliminary test, applying an protective adhesive to the riveted surface of qualified base plate assemblies 100 to form an insulating packaging layer 140 for insulating protection;
S10: installing components 300 according to pre-formed holes, and spacing adjacent components 300 apart by a certain distance for heat dissipation;
S11: installation of connecting wires 400: connecting and fixing one ends of the connecting wires 400 to the components 300 and then placing the other ends of the connecting wires 400 on the conductive posts 200, and fixing the other ends of the connecting wires on the conductive posts by means of conductive screws passing therethrough, thus forming a complete electric conducting state;
S12: finished product testing: re-testing the assembled finished products to screen out defective products to avoid the delivery of defective products; and
S13: packing.

In this embodiment, after being finished in S9, the base plate assembly 100 may be used immediately for assembly or stored in a warehouse for later use.

The above are only preferred embodiments of the invention and only describe the technical principles of the invention in detail. These descriptions are only for explaining the principles of the invention and should not be interpreted as limiting the scope of the invention in any way. Based on the explanations herein, any modifications, equivalent substitutions and improvements made within the spirit and principles of the invention, and other specific embodiments of the invention that those skilled in the art could conceive of without creative effort, should be included within the scope of the invention.

What is claimed is:

1. An easy-to-assemble large-current composite circuit board, comprising a base plate assembly, wherein the base plate assembly consists of an outer shell, an insulating board, a composite circuit board and an insulating packaging layer in turn from top to bottom; the composite circuit board is provided with insulating grooves and mounting holes for conducting electricity; and through holes corresponding to the positions of the mounting holes are formed in the outer shell and the insulating board;

the composite circuit board is made by stacking and pressing a metal layer, an adhesive layer and a polymer material insulating layer in turn, and the insulating grooves and the mounting holes are formed in the metal layer by milling and thinning processing;

the metal layer is made of a pure copper plate, a copper alloy plate or an aluminum alloy plate, the material used for the adhesive layer is prepreg, the thickness of the metal layer is 0.2 mm to 3 mm, the thickness of the polymer material insulating layer is 0.5 mm to 5 mm, and the total thickness of the composite circuit board is 0.9 mm to 8.2 mm;

circuit symbols and related information are printed on the formed outer shell;

the easy-to-assemble large-current composite circuit board further comprising: conductive posts, wherein each of the conductive posts consists of an upper end portion and a lower end portion, the diameter of the lower end portion is less than that of the upper end portion, the lower end portion of the conductive post sequentially passes through the through holes of the outer shell and the insulating plate and the mounting hole of the composite circuit board to be fixedly installed on the base plate assembly, and an upper end face of the upper end portion of the conductive post is provided with an internally threaded hole extending from top to bottom; and components and connecting wires, wherein the components are installed on the base plate assembly, and the connecting wires have one ends connected and fixed to the components and the other ends installed in the internally threaded holes of the conductive posts by means of conductive screws; the circuit board being applicable to electrical boxes or electrical cabinets.

2. The easy-to-assemble large-current composite circuit board according to claim 1, characterized in that: each of the insulating grooves is filled with a sealing layer for isolation and protection, and the sealing layer comprises a sealing film prefabricated from an insulating material or is flow-filled and formed by using a liquid insulating material.

3. The easy-to-assemble large-current composite circuit board according to claim 2, characterized in that: the insulating board, the insulating packaging layer and the sealing layer are made of epoxy resin materials; the polymer material insulating layer is made of an epoxy resin, a glass fiber board, a bakelite board, a silica gel board or a plastic board.

4. A manufacturing process for an easy-to-assemble large-current composite circuit board, comprising the easy-to-assemble large-current composite circuit board according to claim 2, characterized in that the manufacturing process comprises the following steps:

S1: material preparation and pressing formation of a composite circuit board: pressing a metal layer, an adhesive layer and a polymer material insulating layer into a whole board by a pressing device;

S2: machining of the composite circuit board: milling and thinning a metal plate of the composite circuit board by means of a numerical control milling machine to form insulating grooves and mounting holes;

S3: placing a sealing layer into each insulating groove on the composite circuit board, wherein the sealing layer is prefabricated or poured into the insulating groove in the form of a fluid;

S4: performing laser cutting by means of laser equipment to form an outer shell, and processing the outer shell by means of sheet-metal working equipment;

S5: printing circuit symbols and related information on the formed outer shell;

S6: installation of conductive posts: riveting the conductive posts to the composite circuit board by means of a riveting machine according to the pre-formed mounting holes, with a lower end of each conductive post being riveted and fixed to the composite circuit board to achieve a conducting effect;

S7: assembly of a base plate assembly: placing the insulating plate and the composite circuit board with the riveted conductive posts into the outer shell in turn for stacking and assembly, and then providing an adhesive material at a connection between the composite circuit board and an inner end face of the outer shell;

S8: preliminary test and inspection: conducting a power-on test on the base plate assembly provided with the conductive posts to detect whether there is a short circuit;

S9: after the completion of the preliminary test, applying an protective adhesive to the riveted surface of qualified base plate assemblies to play a role of insulating protection;

S10: installing components according to pre-formed holes, and spacing adjacent components apart by a certain distance for heat dissipation;

S11: installation of connecting wires: connecting and fixing one ends of the connecting wires to the components and then placing the other ends of the connecting wires on the conductive posts, and screwing and fixing the other ends of the connecting wires on the conductive posts by means of conductive screws passing therethrough, thus forming a complete electric conducting state;

S12: finished product testing: re-testing the assembled finished products to screen out defective products; and S13: packing.

5. The manufacturing process for an easy-to-assemble large-current composite circuit board according to claim 4, characterized in that: after being finished in S9, the base plate assembly is used immediately for assembly or stored in a warehouse for later use.

6. The easy-to-assemble large-current composite circuit board according to claim 1, characterized in that: the conductive posts are installed and fixed on the base plate assembly by means of a riveting technique, so that the lower end portions of the conductive posts are fixed to the lower end face of the composite circuit board by means of riveting.

7. The easy-to-assemble large-current composite circuit board according to claim 1, further comprising components and connecting wires, wherein the components are installed and fixed on the base plate assembly, the connecting wires are provided between the components and the conductive posts, and the connecting wires have one ends connected and fixed to the components and the other ends installed in the internally threaded holes of the conductive posts by means of conductive screws, thereby realizing a conducting state.

* * * * *